US012537165B2

(12) United States Patent
Rowland

(10) Patent No.: US 12,537,165 B2
(45) Date of Patent: Jan. 27, 2026

(54) ADJUSTABLE EXIT ANGLE SOURCE FOR IONS AND NEUTRAL PARTICLES

(71) Applicant: Applied Materials, Inc., Santa Clara, CA (US)

(72) Inventor: Christopher A. Rowland, Rockport, MA (US)

(73) Assignee: Applied Materials, Inc., Santa Clara, CA (US)

( * ) Notice: Subject to any disclaimer, the term of this patent is extended or adjusted under 35 U.S.C. 154(b) by 345 days.

(21) Appl. No.: 18/370,158

(22) Filed: Sep. 19, 2023

(65) Prior Publication Data

US 2025/0095949 A1 Mar. 20, 2025

(51) Int. Cl.
*H01J 37/32* (2006.01)

(52) U.S. Cl.
CPC .............................. *H01J 37/32009* (2013.01)

(58) Field of Classification Search
USPC ...................................................... 250/423 R
See application file for complete search history.

(56) References Cited

U.S. PATENT DOCUMENTS

2010/0243879 A1 9/2010 Huang et al.
2011/0155057 A1 6/2011 Kato et al.
2015/0069017 A1 3/2015 Buonodono
2019/0122860 A1 4/2019 Lee et al.
2019/0368959 A1* 12/2019 Brucker ................ G01M 3/205
2020/0185201 A1 6/2020 Kurunczi et al.
2020/0194226 A1 6/2020 Kurunczi et al.
2021/0189566 A1 6/2021 Hautala et al.
2023/0050650 A1 2/2023 Chang et al.

FOREIGN PATENT DOCUMENTS

JP 2011-151343 A 8/2011
TW 202034374 A 9/2020
TW 202038283 A 10/2020
TW 202124770 A 7/2021

OTHER PUBLICATIONS

International Search Report and Written Opinion mailed Nov. 18, 2024 in corresponding PCT application No. PCT/US2024/039573.

* cited by examiner

*Primary Examiner* — Kiet T Nguyen
(74) *Attorney, Agent, or Firm* — Nields, Lemack & Frame, LLC

(57) ABSTRACT

A plasma source having an adjustable exit aperture is disclosed. The plasma source has a cylindrical body and two ends, wherein a housing aperture is formed along the cylindrical body. An adjustable output plate is disposed on the cylindrical body and covers the housing aperture. The adjustable output plate has an exit aperture, smaller than the housing aperture. The adjustable output plate is capable of rotation in the circumferential direction, thus moving the position of the exit aperture relative to a workpiece holder. The plasma source is configured such that changes to the exit angle may be performed without breaking vacuum. In some embodiments, a defining aperture is located outside the exit aperture to define the path of radicals and neutrals. In other embodiments, biased electrodes may be disposed outside the exit aperture.

19 Claims, 9 Drawing Sheets

ADJUSTABLE EXIT ANGLE SOURCE FOR IONS AND NEUTRAL PARTICLES

FIELD

Embodiments of the present disclosure relate to a plasma source capable of adjusting the exit angle of neutral particles and ions that exit the plasma source.

BACKGROUND

The fabrication of a semiconductor device involves a plurality of discrete and complex processes. Recently, there has been a transition to create three dimensional devices in the semiconductor industry. As the name suggests, these semiconductor devices have a length and width, but also have a height. To process these three-dimensional devices, angled ion implants may be used.

Angled ion implants refer to those ion beams which strike the substrate at a non-zero angle. For consistency, an angle of 0° is defined as one in which the ion beam strikes the substrate at an angle perpendicular to the surface of the substrate. Angled ion beams have many applications. For example, they may be used to implant a sidewall of a fin structure or a trench. Further, other angled beams, such as beams comprising radicals or neutrals, may be used for etching processes, deposition processes and other applications.

One way to perform these angled processes is to rotate or tilt the platen on which the substrate is disposed. In other words, the beam is generated in the traditional manner, but the platen is tilted so that the beam strikes the substrate at a non-zero angle. This approach may allow the generation of a beam which strikes the substrate at an angle of 20° or more.

One shortcoming with this approach is that the various regions of the substrate are at different distances from the beam source. For example, by tilting, several regions of the substrate will be closer to the beam source than other regions. This may cause process variations across the substrate.

Another approach is to control and vary the shape of the plasma sheath to vary the angle of the ions extracted from a plasma processing chamber. However, this approach may have limitations in terms of the amount of current that may be extracted and may be specific to ions.

Further, there may be instances where different exit angles are used for different processes. Therefore, it would be advantageous if there was a system that had an exit aperture, with an exit angle that could be adjusted. Further, it would be beneficial if this plasma source was useful for both charged ions and neutral particles.

SUMMARY

A plasma source having an adjustable exit aperture is disclosed. The plasma source has a cylindrical body and two ends, wherein a housing aperture is formed along the cylindrical body. An adjustable output plate is disposed on the cylindrical body and covers the housing aperture. The adjustable output plate has an exit aperture, smaller than the housing aperture. The adjustable output plate is capable of rotation in the circumferential direction, thus moving the position of the exit aperture relative to a workpiece holder. The plasma source is configured such that changes to the exit angle may be performed without breaking vacuum. In some embodiments, a defining aperture is located outside the exit aperture to define the path of radicals and neutrals. In other embodiments, biased electrodes may be disposed outside the exit aperture.

According to one embodiment, a plasma source for generation of ions and neutral particles is disclosed. The plasma source comprises a chamber housing having a cylindrical body and two ends, defining a plasma chamber, wherein a housing aperture is disposed in the cylindrical body along a circumferential direction; a plasma generator to generate a plasma within the plasma chamber; and an adjustable output plate disposed outside the cylindrical body and covering the housing aperture, the adjustable output plate having an arc shape and having a length in the circumferential direction larger than the housing aperture, wherein the adjustable output plate has an exit aperture, and the adjustable output plate is rotatable relative to the housing aperture. In some embodiments, the housing aperture occupies a distance that corresponds to at least 30° of a perimeter of the cylindrical body. In some embodiments, the plasma source comprises an external plate affixed to the adjustable output plate having a defining aperture that is aligned with the exit aperture. In certain embodiments, the external plate is electrically connected to the adjustable output plate. In certain embodiments, the external plate is electrically isolated from the adjustable output plate and biased at a voltage different from the adjustable output plate. In certain embodiments, the plasma source comprises at least one additional electrode, biased at a different voltage than the external plate, disposed outside and aligned with the exit aperture. In some embodiments, the housing aperture defines a range of motion for the adjustable output plate, and the range of motion is at least 30°. In some embodiments, the plasma source comprises a motor in communication with the adjustable output plate, wherein actuation of the motor is used to rotate the adjustable output plate relative to the housing aperture so as to change an angle of the exit aperture relative to a workpiece holder.

According to another embodiment, a plasma source for generation of ions and neutral particles is disclosed. The plasma source comprises a chamber housing having a cylindrical body and two ends, defining a plasma chamber, wherein a housing aperture is disposed in the cylindrical body along a circumferential direction; a plasma generator to generate a plasma within the plasma chamber and an adjustable output plate disposed outside the cylindrical body, wherein the adjustable output plate comprises an upper adjustable output plate portion and a lower adjustable output plate portion which are rotatable relative to the chamber housing, and wherein a space between the upper adjustable output plate portion and the lower adjustable output plate portion defines an exit aperture through which the ions and neutral particles exit the plasma chamber. In some embodiments, the range of motion of the exit aperture is at least 30°. In some embodiments, a size of the exit aperture in a circumferential direction is adjustable. In some embodiments, the plasma source comprises an external plate comprising an upper external plate portion affixed to the upper adjustable output plate portion and a lower external plate portion affixed to the lower adjustable output plate portion, wherein a space between the upper external plate portion and the lower external plate portion defines a defining aperture, wherein the defining aperture is aligned with the exit aperture. In certain embodiments, the upper external plate portion is electrically connected to the upper adjustable output plate portion and the lower external plate portion is electrically connected to the lower adjustable output plate portion. In certain embodiments, the upper external plate portion and the lower external plate portion are electrically isolated from the adjustable output plate and biased at a voltage different from the adjustable output plate. In certain embodiments, the plasma source comprises at least one additional electrode, biased at a different voltage than the upper external plate portion and the lower external plate portion, disposed outside and aligned with the exit aperture. In some embodiments, the plasma source comprises at least one motor in communication with the upper adjustable output plate portion and the lower adjustable output plate portion, wherein actuation of the at least one motor is used to rotate the upper adjustable output plate portion and the lower adjustable output plate portion relative to the housing aperture so as to change an angle of the exit aperture relative to a workpiece holder and/or a size of the exit aperture. In some embodiments, the upper adjustable output plate portion and the lower adjustable output plate portion are independently rotatable.

According to another embodiment, a processing system is disclosed. The processing system comprises any of the plasma sources described above and a workpiece holder, movable in a scan direction.

BRIEF DESCRIPTION OF THE FIGURES

For a better understanding of the present disclosure, reference is made to the accompanying drawings, which are incorporated herein by reference and in which.

DETAILED DESCRIPTION

As described above, angled semiconductor processes, such as angled implant, deposition and etch processes are becoming increasingly common in the semiconductor industry. Therefore, a system that allows a wide range of exit angles, and consequentially, a wide range of angles of incidence, would be very beneficial.

Figure 1:
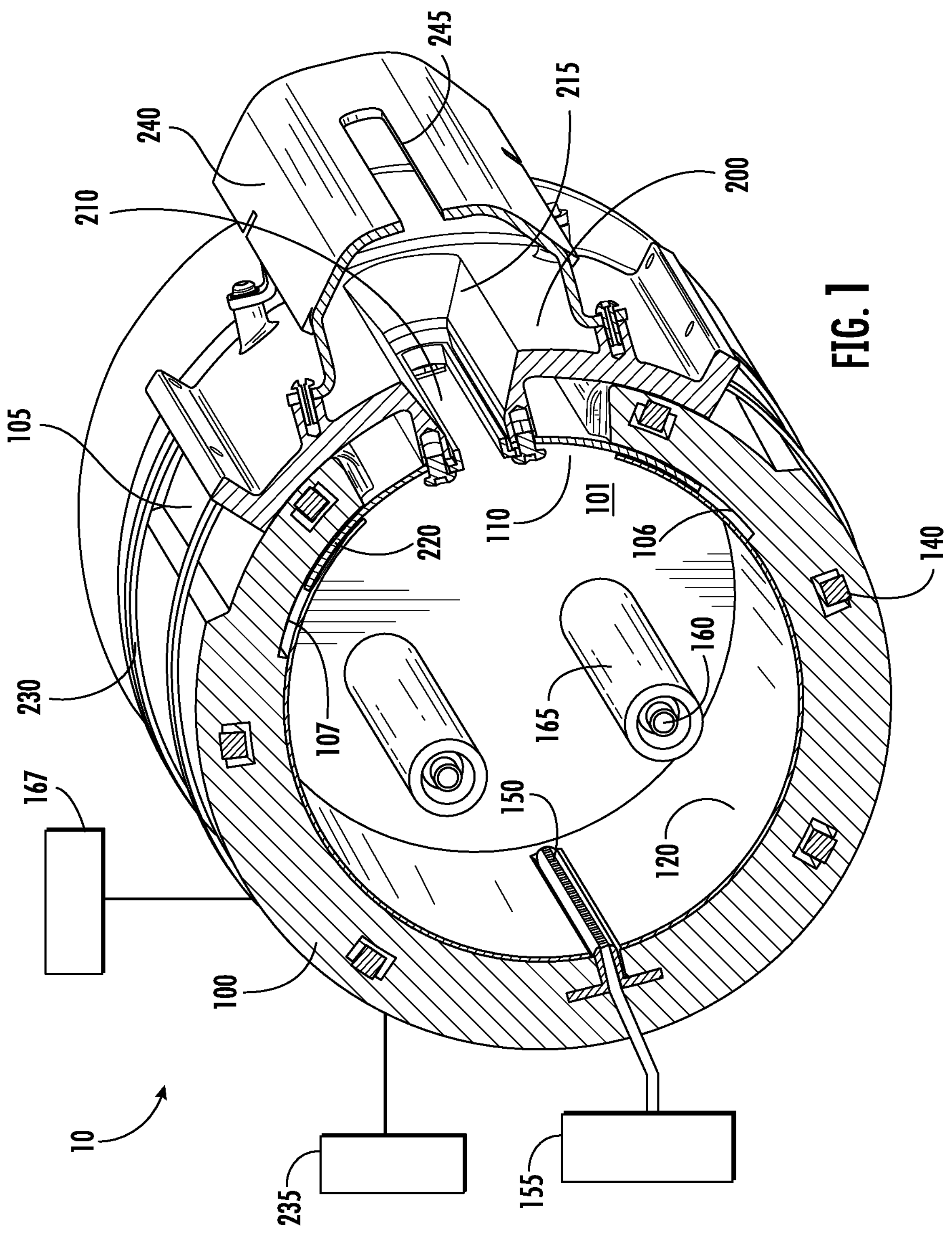
FIG. 1 is a block diagram of a plasma source having an adjustable exit aperture according to one embodiment.

FIG. 1 shows a cross-sectional view of a plasma source 10 having an adjustable exit aperture which allows for angled ion and neutral particle extraction. The plasma source 10 includes a chamber housing 100, having a cylindrical body, and two closed ends, which define a plasma chamber 101. The two ends are not shown for clarity. The cylindrical body of the chamber housing 100 has an inner surface having an inner diameter and an outer surface having an outer diameter. Additionally, the chamber housing 100 also includes a housing aperture 110 located along the perimeter of the cylindrical body. The housing aperture 110 is an opening in the chamber housing 100 and has a width, which is the direction between the two ends. The housing aperture 110 also has a height, which is in the circumferential direction along the cylindrical body. In some embodiments, the housing aperture 110 extends across the entire width of the chamber housing 100. In other embodiments, the housing aperture 110 may not extend to the two ends. This housing aperture 110 may be as large as half of the perimeter of the cylindrical body of the chamber housing 100, also defined as 180°. In other embodiments, the housing aperture 110 may be a smaller portion of the total perimeter of the cylindrical body of the chamber housing 100, such as a quarter of the perimeter (90°), a sixth of the perimeter (60°) or a twelfth of the perimeter (30°). In some embodiments, an indented portion 105 exists on both sides of the housing aperture 110 along the outer surface of the cylindrical body in the circumferential direction. This indented portion 105 may have an outer diameter that is smaller than the outer diameter of the rest of the cylindrical body of the chamber housing 100. The indented portion 105 may be used as a guide for the adjustable output plate 200. A recessed portion 106 may also exist along the interior surface of the chamber housing 100 on both sides of the housing aperture 110.

The plasma source 10 may also include one or more liners 120 disposed within the plasma chamber 101 along the interior wall of the cylindrical body of the chamber housing 100. Note that the liners 120 may extend to the housing aperture 110. This creates a channel 107 between the liner 120 and the recessed portion 106. In some embodiments, one or more magnets 140 may be disposed in the chamber housing 100. The plasma source 10 also includes a gas inlet 150, which is in communication with a gas source 155.

In this embodiment, one or more antennas 160 are disposed within the plasma chamber 101. In some embodiments, the antennas 160 are constructed of a conductive material, such as a metal, and may be protected by an insulating cover 165. The insulating cover 165 may be quartz or alumina in some embodiments. The antennas may be powered using an RF power supply 167. These antennas 160 serve as a plasma generator. In some embodiments, the one or more antennas 160 are positioned such that the highest plasma density is not in the center of the plasma chamber 101, but rather is disposed closer to the housing aperture 110. Note that the disclosure is not limited to this plasma generator. For example, in other embodiments, the plasma generator may include a coil disposed outside the chamber housing 100, a cathode disposed within the plasma chamber 101, a filament disposed within the plasma chamber 101, or another plasma generator.

An adjustable output plate 200 is located outside the chamber housing 100 and is proximate to the housing aperture 110. The adjustable output plate 200 is in electrical contact with the chamber housing 100 so as to be biased at the same voltage (or ground) as the chamber housing 100. Specifically, the adjustable output plate 200 has an arced shape, where the inner diameter of the adjustable output plate 200 may be slightly larger than the outer diameter of the indented portion 105. The adjustable output plate 200 is larger in the circumferential direction than the housing aperture 110. Thus, if the housing aperture 110 occupies a distance that corresponds to 30° of the perimeter of the cylindrical body of the chamber housing 100, the adjustable output plate 200 may have a length in the circumferential direction that corresponds to at least 60° of the perimeter of the cylindrical body of the chamber housing 100 to allow 30° of rotation. The portion of the adjustable output plate 200 that exceeds the size of the housing aperture 110 in the circumferential direction rests in the indented portion 105 of the chamber housing 100. The adjustable output plate 200 may be as large as or larger than the housing aperture 110 in the width direction. The adjustable output plate 200 also includes an exit aperture 210. The exit aperture 210 may be disposed along the center of the adjustable output plate 200 in the circumferential direction. The exit aperture 210 is defined by aperture walls 215 that extend from the outer surface of the adjustable output plate 200 toward the interior of the plasma chamber 101. In some embodiments, the aperture walls 215 may extend inward such that they extend to a point that is roughly equal to the inner diameter of the chamber housing 100. A plate liner 220 may be affixed to the adjustable output plate 200 and extend circumferentially from the aperture walls 215. In some embodiments, the plate liner 220 is disposed in the channel 107 formed between the liner 120 and the recessed portion 106. In other embodiments, the plate liner 220 is disposed further inward than the liner 120, such that the liner 120 is between the plate liner 220 and the chamber housing 100. In this way, a liner, which may be liner 120 or plate liner 220, surrounds the interior of the cylindrical body of the chamber housing 100 with the exception of the exit aperture 210 and optionally the gas inlet 150. The aperture walls 215 define the range of motion of the adjustable output plate 200. Specifically, at the end of its range of motion in each direction, the aperture walls 215 contact the chamber housing 100, which serves as a stop.

In this embodiment, the size of the exit aperture 210 in the circumferential direction may be fixed. In some embodiments, the size of the exit aperture 210 in the circumferential direction may be about 10° of the entire perimeter of the cylindrical body of the chamber housing 100. Of course, different adjustable output plates 200 may be used with a chamber housing 100, wherein each adjustable output plate 200 has a differently dimensioned exit aperture 210. Further, the exit aperture 210 may be the same size or smaller than the housing aperture 110 in the width direction. For example, the housing aperture 110 may extend across all or nearly all of the width of the chamber housing 100, while the width of the exit aperture 210 may be smaller. Additionally, if desired, baffling may be incorporated into the exit aperture 210. For example, vertical slats may be installed in the exit aperture 210. These vertical slats serve to reduce the amount of angular spread in the width direction of the beam.

The adjustable output plate 200 may be held against the chamber housing 100. In one embodiment, fasteners 230 may be used to secure the adjustable output plate 200 to the chamber housing 100. For example, the fasteners 230 may connect to the adjustable output plate 200 at its opposite ends in the circumferential direction and wrap around the outer surface of the chamber housing 100. The fasteners 230 are tightened so as to press the adjustable output plate 200 against the chamber housing 100.

In another embodiment, the fasteners 230 may be in communication with a motor 235, which is adapted to rotate the fasteners 230 relative to the chamber housing 100 to move the position of the adjustable output plate 200. For example, the outer surface of the fasteners 230 may have teeth, and contact a gear, attached to the motor 235. Rotation of the gear serves to rotate the adjustable output plate 200. The fasteners 230 may move within a grooved channel located on the outer surface of the cylindrical body.

In another embodiment, fasteners with teeth may not be used. Rather, the motor 235 may include a rotatable shaft, pivotably connected to one or more lever arms. The distal end of the lever arms may pivotably attach to the adjustable output plate 200. Rotation of the rotatable shaft causes the lever arms to move toward or away from the adjustable output plate 200, causing it to rotate. The lever arms may also serve to hold the adjustable output plate 200 against the chamber housing 100. Of course, other types of motors and attachment mechanisms may be employed to allow rotation of the adjustable output plate 200 and the present disclosure is not limited to these embodiments.

In certain embodiments, an external plate 240 is affixed to the adjustable output plate 200. This external plate 240 may include an aperture, referred to as a defining aperture 245. The defining aperture 245 is aligned with the exit aperture 210. The defining aperture 245 provides additional collimation of the particles that exit the exit aperture 210. In operation, the pressure within the plasma chamber 101 may be much greater than that in the rest of the chamber. In some embodiments, the defining aperture 245 may be roughly 50 mm from the exit aperture 210. This distance results in lower pressure near the defining aperture 245, which in turn results in greater free mean path lengths for any ions or particles passing through the defining aperture 245.

In some embodiments, the external plate 240 is electrically connected to the adjustable output plate 200. In these embodiments, the external plate 240 does not attract charged ions from the plasma chamber 101. Rather, the defining aperture 245 serves to confine the path of neutral particles and radicals that are extracted from the plasma chamber 101.

Figure 6:
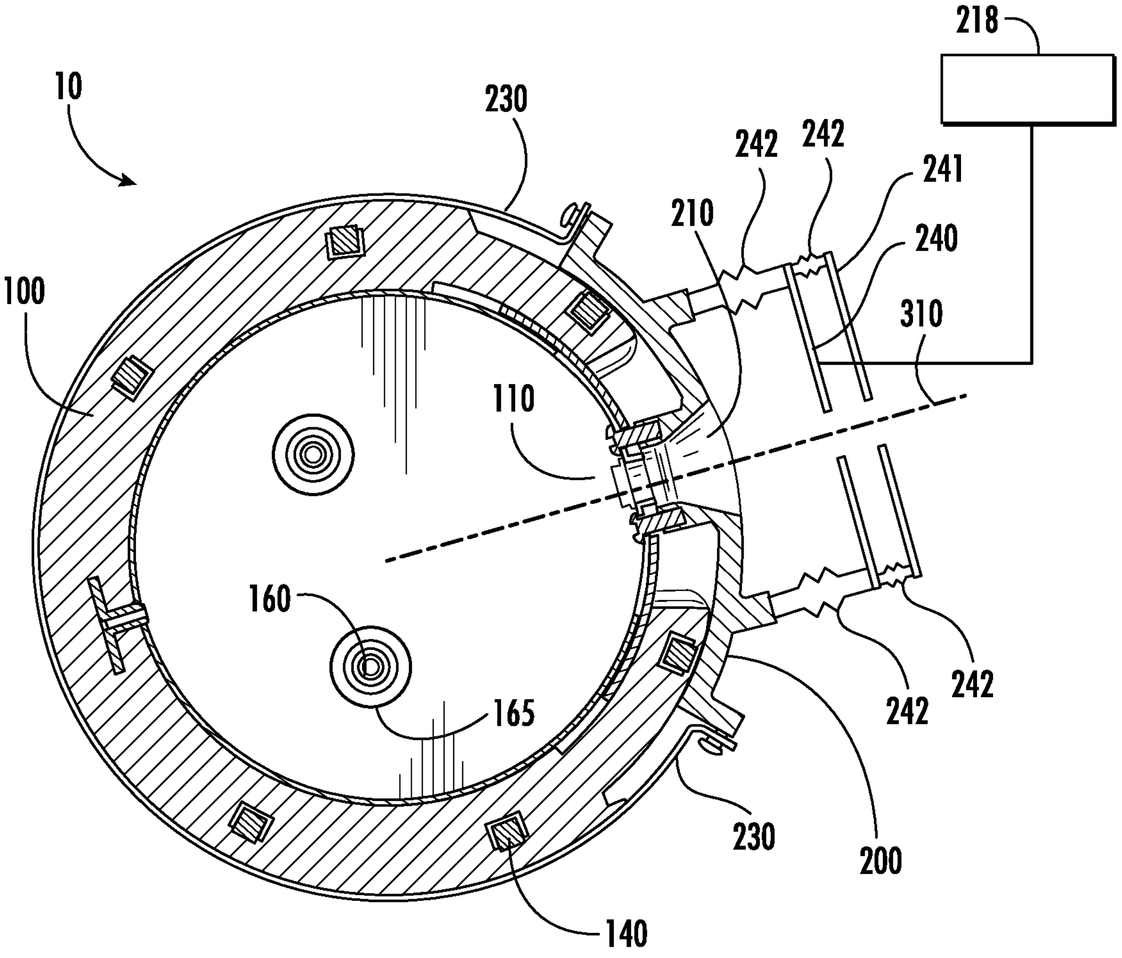
FIG. 6 shows a plasma source with electrodes located outside the exit aperture.

In other embodiments, shown in FIG. 6, the external plate 240 may be electrically isolated from the adjustable output plate 200, such as through the use of insulators 242. In these embodiments, a voltage different from the voltage applied to the chamber housing 100 may be applied to the external plate 240. In certain embodiments, the external plate 240 may be negatively biased relative to the chamber housing 100 using electrode power supply 218. This negative bias is applied so as to attract positive ions from the plasma chamber 101. Thus, in this embodiment, the external plate 240 serves as an extraction electrode. Further, additional electrodes, such as ground electrode 241, may be disposed outside the exit aperture 210. Each of these electrodes includes an aperture, which are typically aligned with the exit aperture 210, such that ions extracted through the exit aperture 210 travel through the aligned apertures in each of the electrodes. Note that, while not shown, this embodiment may also include other components described in FIG. 1, such as motor 235, the RF power supply 167, liner 120, plate liner 220, the gas inlet 150 and the gas source 155.

Thus, in operation, one or more processing gasses are supplied from the gas source 155 to the plasma chamber 101 through the gas inlet 150. RF power from the RF power supply 167 is provided to the antennas 160. The antennas 160 create RF energy, which causes the processing gasses within the plasma chamber 101 to become ionized and form a plasma. Magnets 140 serve to direct the plasma toward the center of the plasma chamber 101 and away from the chamber housing 100.

In the embodiment of FIG. 1, where the external plate 240 is electrically connected to the adjustable output plate 200, particles, which may be neutrals or radicals, drift out of the plasma chamber 101 through the exit aperture 210. Some of these particles then pass through the defining aperture 245 and proceed toward the workpiece.

In the embodiment of FIG. 6, where the external plate 240 is electrically biased separate from the adjustable output plate 200, ions are drawn through the exit aperture 210 by the voltage applied to the external plate 240. These ions then pass through the aligned apertures of the electrodes and proceed toward the workpiece.

Figure 2A:
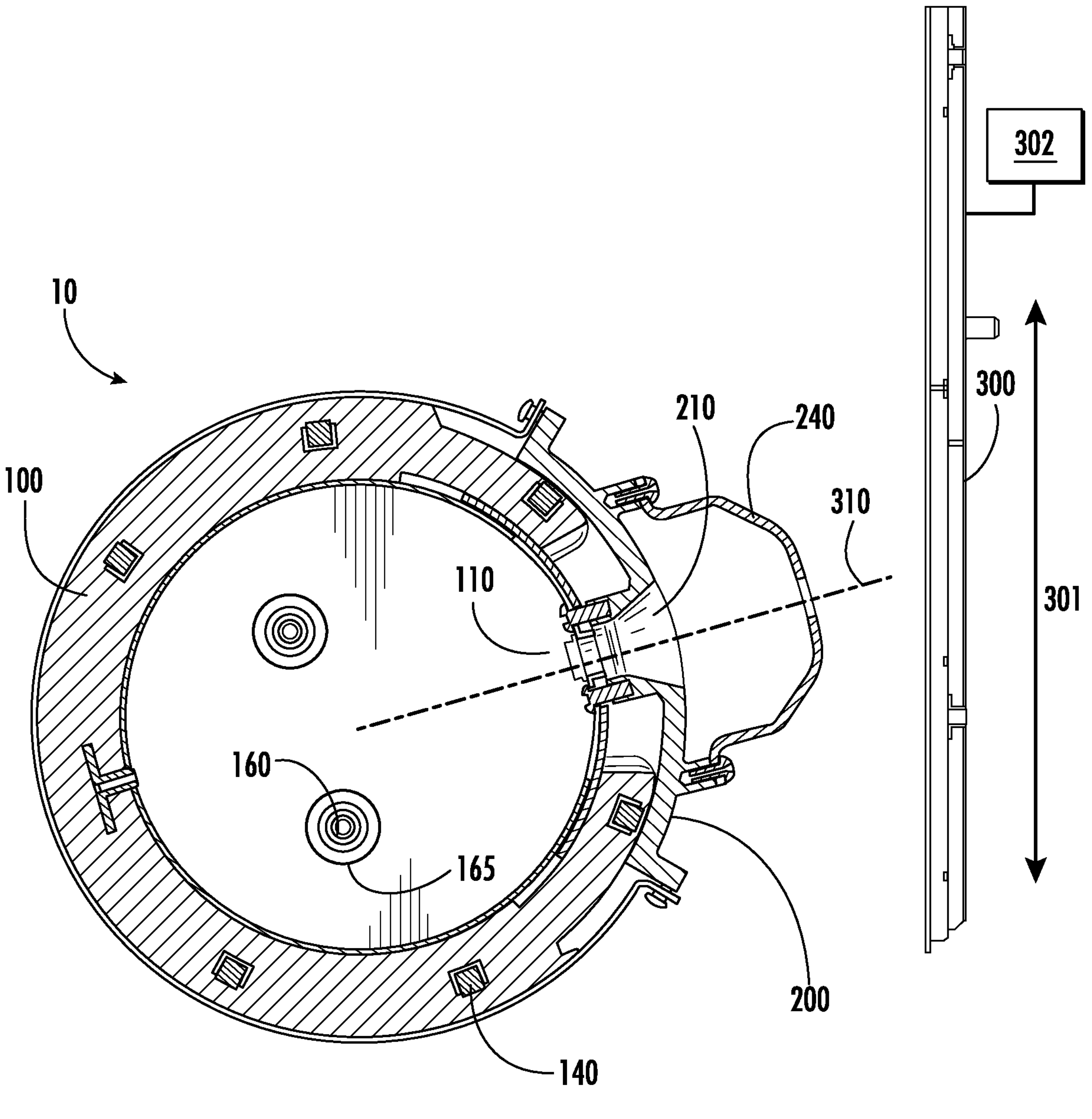
FIGS. 2A-2C show the plasma source of FIG. 1 with the adjustable output plate in three different positions.
Figure 2B:
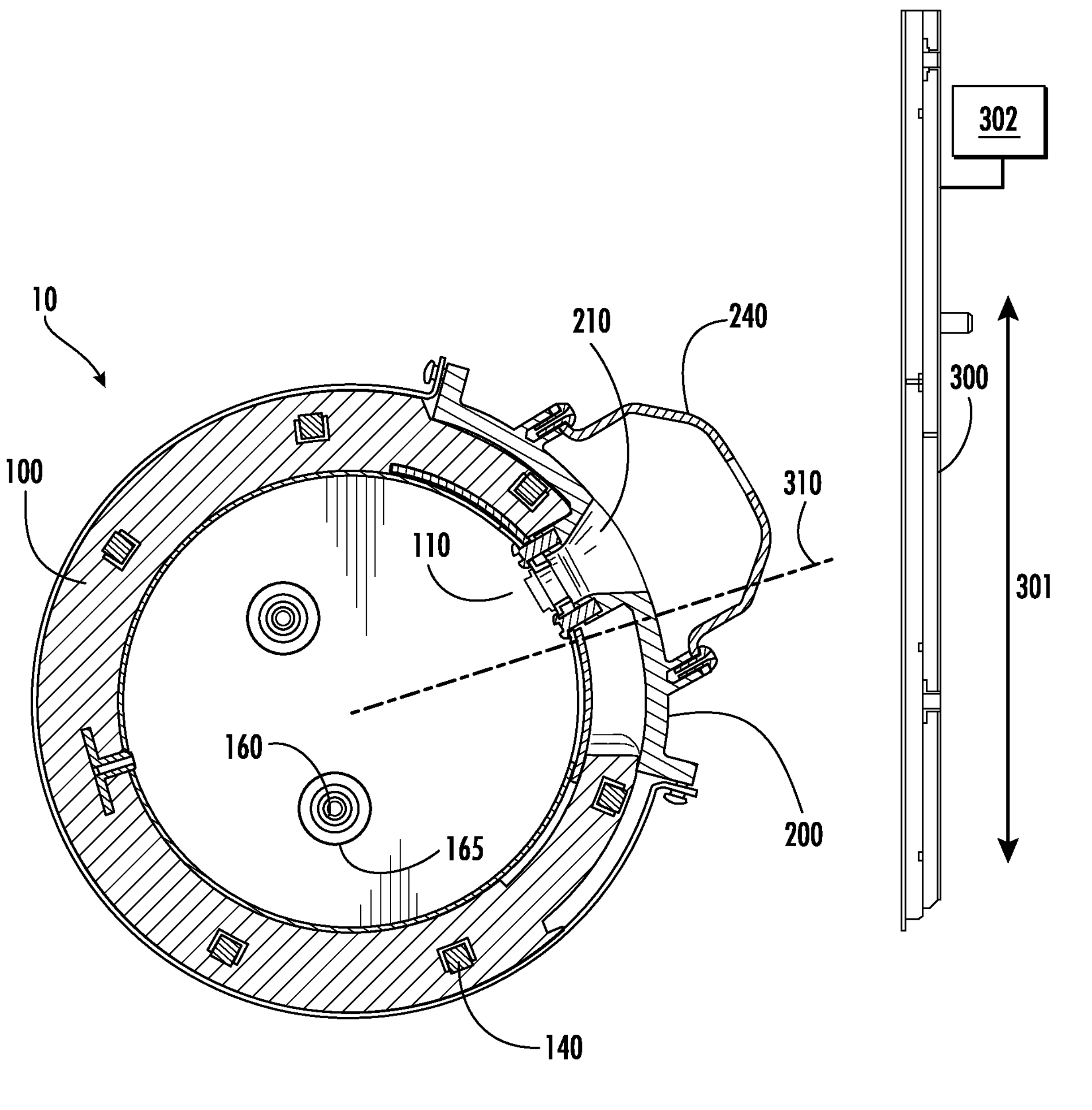
Figure 2C:
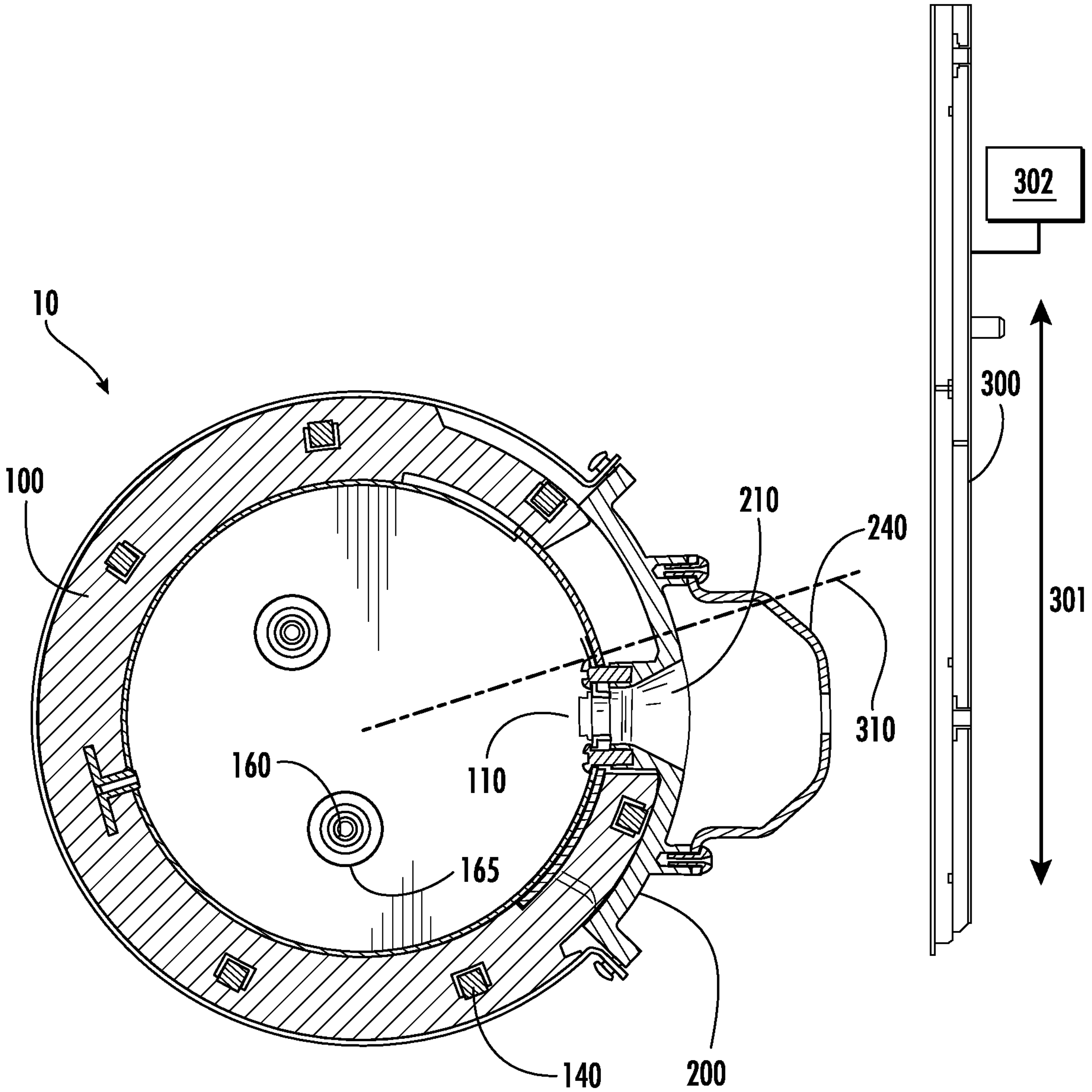

FIGS. 2A-2C show the plasma source 10 with the adjustable output plate 200 in three different positions. A workpiece holder 300 is also shown in each figure. The workpiece holder 300 may be scanned in scan direction 301, which may be perpendicular to the width of the exit aperture 210. A scan motor 302 may be used to scan the workpiece holder 300.

The workpiece holder 300 may be grounded or biased at a extraction voltage. Further, the temperature of the workpiece holder 300 may be controlled, based on the type of process being performed on the workpiece. The workpiece holder 300 may be an electrostatic chuck, although mechanical clamps or gravity may be used to secure the workpiece to the workpiece holder 300. Additionally, the workpiece holder 300 may be capable of rotation about an axis that is perpendicular to the front surface of the workpiece holder 300 using a platen motor.

The scan motor 302 may allow the workpiece holder 300 to move along the scan direction 301 from a first position to a second position. In some embodiments, the first position and the second position are located such that the workpiece is no longer impacted by the beam exiting the plasma source 10 while in these positions. The first and second positions may be referred to as the endpoints of the scan, such that the workpiece holder 300 moves from the first position along the scan direction 301 to the second position and then reverses direction to return to the first position. Note that while in the first and second position, other actions may take place. For example, the workpiece holder 300 may rotate 180° about an axis perpendicular to the surface of the workpiece holder 300 such that the beam from the plasma source 10 processes the workpiece at a different angle.

In each of these figures, the plasma source 10 is oriented such that the centerline 310 of the plasma source 10 is at an angle of 15° relative to a line that is normal to the workpiece holder 300. In these embodiments, the centerline 310 may be defined as the perpendicular bisector of a line connecting the two antennas 160. In other embodiments, the centerline 310 may be defined as the midpoint of the range of motion of the adjustable output plate 200. In FIG. 2A, the adjustable output plate 200 is oriented at its midpoint position, such that the centerline 310 corresponds to the exit aperture 210. Thus, in this position, the particles that exit the exit aperture 210 are directed toward the workpiece holder 300 at an incident angle of 15°. In FIG. 2B, the adjustable output plate 200 is rotated counterclockwise to the point where its range of motion is terminated by the chamber housing 100. Note that, in this embodiment, this represents a rotation of 15°. In this way, the particles that exit the exit aperture 210 are directed toward the workpiece holder 300 at an incident angle of 30°. FIG. 2C shows a configuration where the adjustable output plate 200 is rotated in the clockwise direction to the point where its range of motion is terminated by the chamber housing 100. Note that, in this embodiment, this represents a rotation of −15°. In this way, the particles that exit the exit aperture 210 are directed toward the workpiece holder 300 at an incident angle of 0°.

Thus, in this embodiment, the plasma source 10 has a chamber housing 100 that includes a cylindrical body and two ends, wherein the cylindrical body includes a housing aperture 110 having a width and extending in the circumferential direction. A plasma generator, such as antennas 160, are used to generate a plasma within the plasma chamber 101. The housing aperture 110 may occupy a distance that corresponds to at least 30° of the perimeter of the cylindrical body. An adjustable output plate 200 is disposed outside the chamber housing 100 and is arc shaped. The length of the adjustable output plate 200 in the circumferential direction is larger than the housing aperture 110. In this way, the adjustable output plate 200 covers the housing aperture 110. Further, the adjustable output plate 200 includes an exit aperture 210, which is smaller in the circumferential direction than the housing aperture 110. Further, the adjustable output plate 200 and the chamber housing 100 are configured such that the size and position of the housing aperture 110 may define the range of motion of the adjustable output plate 200. Specifically, in some embodiments, the adjustable output plate 200 has aperture walls 215 that extend inward and contact the chamber housing 100 at the furthest extent of its range of motion.

Figure 3A:
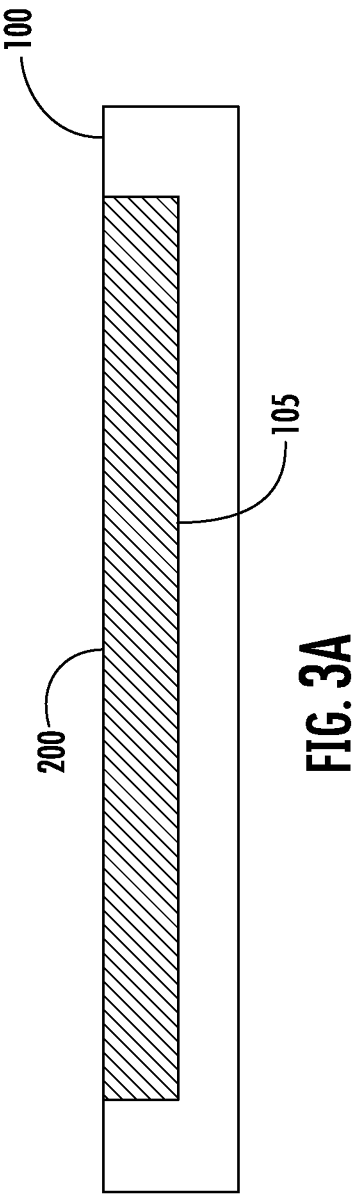
FIGS. 3A-3B show the interface between the chamber housing and the adjustable output plate according to two different embodiments.

FIGS. 1, 2A-2C and 6 show a plasma source 10 that includes a unitary adjustable output plate 200. In this embodiment, the adjustable output plate 200 may be secured by simply pressing it against the outer surface of the chamber housing 100 as explained above. Thus, as shown in FIGS. 1 and 6, the adjustable output plate 200 simply rests against the indented portion 105. Compressive forces caused by the tightening of the fasteners 230 creates friction which holds the adjustable output plate 200 in place. FIG. 3A shows a cross section of these components.

Figure 3B:
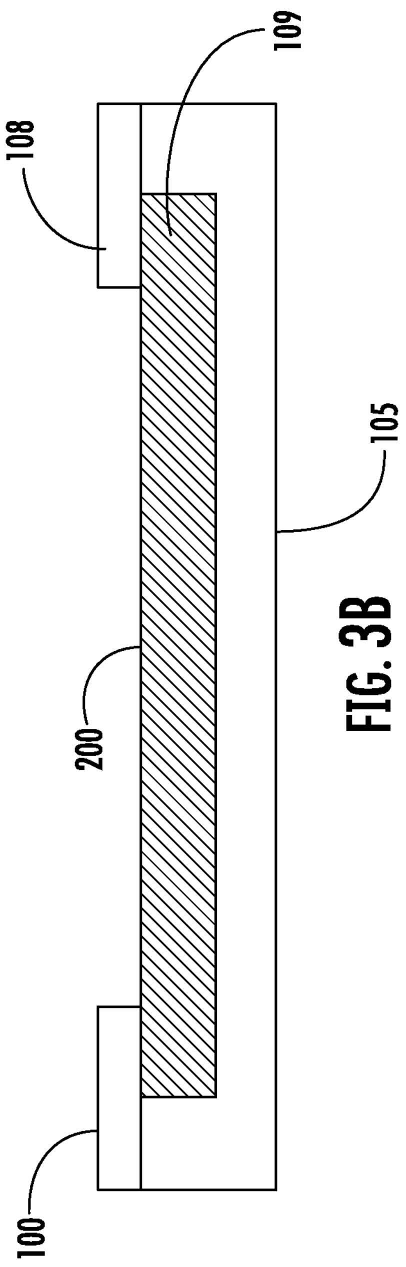

However, in certain embodiments, the outer surface of the cylindrical body may include overhanging portions 108 disposed adjacent to the indented portion 105 in the width direction that define a channel 109. In this embodiment, shown in the cross section shown in FIG. 3B, the adjustable output plate 200 may be located in the channel 109 and secured by the overhanging portions 108. In this embodiment, compressive force is not needed to hold the adjustable output plate 200 in place and therefore the adjustable output plate 200 may not be pressed against the chamber housing 100. Further, this configuration also allows use of the motor with lever arms as described earlier.

Figure 4:
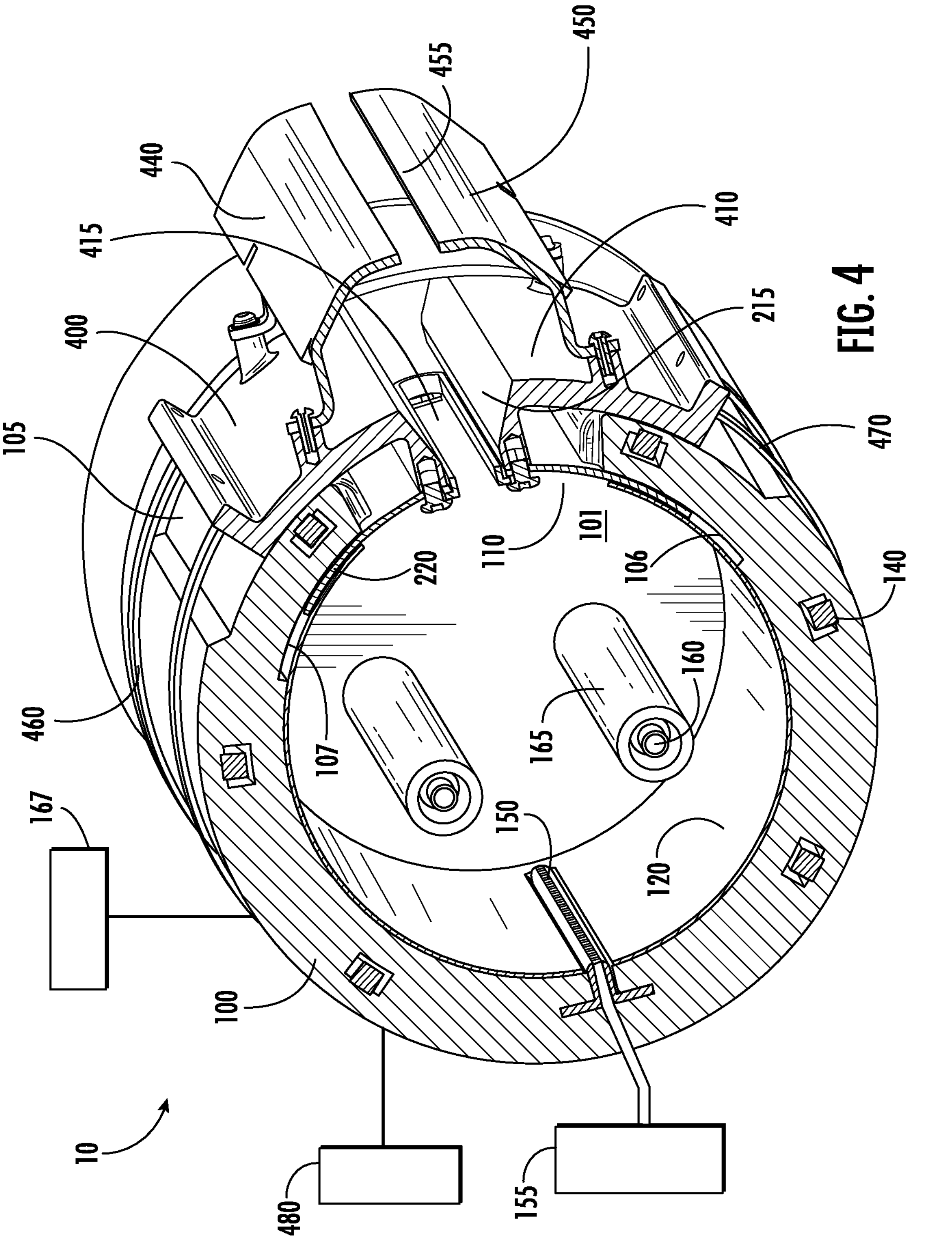
FIG. 4 shows a block diagram of a plasma source having an adjustable exit aperture where the size of the exit aperture is also adjustable.

By incorporating the channel 109, it is also possible to separate the adjustable output plate 200 into two pieces. FIG. 4 shows such an embodiment, wherein the adjustable output plate 200 of FIG. 1 now comprises an upper adjustable output plate portion 400 and a lower adjustable output plate portion 410. The space between the upper adjustable output plate portion 400 and a lower adjustable output plate portion 410 defines the exit aperture 415. Note that since there are now two adjustable output plates, the size of the exit aperture 415, in the circumferential direction, may be varied as well.

Similarly, the external plate 240 now comprises an upper external plate portion 440 and a lower external plate portion 450. The space between the upper external plate portion 440 and the lower external plate portion 450 defines the defining aperture 455. Note that the size of the defining aperture 455, in the circumferential direction, varies with the size of the exit aperture 415.

In this embodiment, the fasteners 230 may not wrap around the entirety of the chamber housing 100. Rather, there may be a set of upper fasteners 460 that are used to move and secure the upper adjustable output plate portion 400 and a set of lower fasteners 470 that are used to move and secure the lower adjustable output plate portion 410. In certain embodiments, each set of fasteners may be in communication with a respective motor 480. The means for attaching the output plate portions to the motors may be one of those described above or may be a different mechanism. The rest of the plasma source 10 is as described above.

Figure 5A:
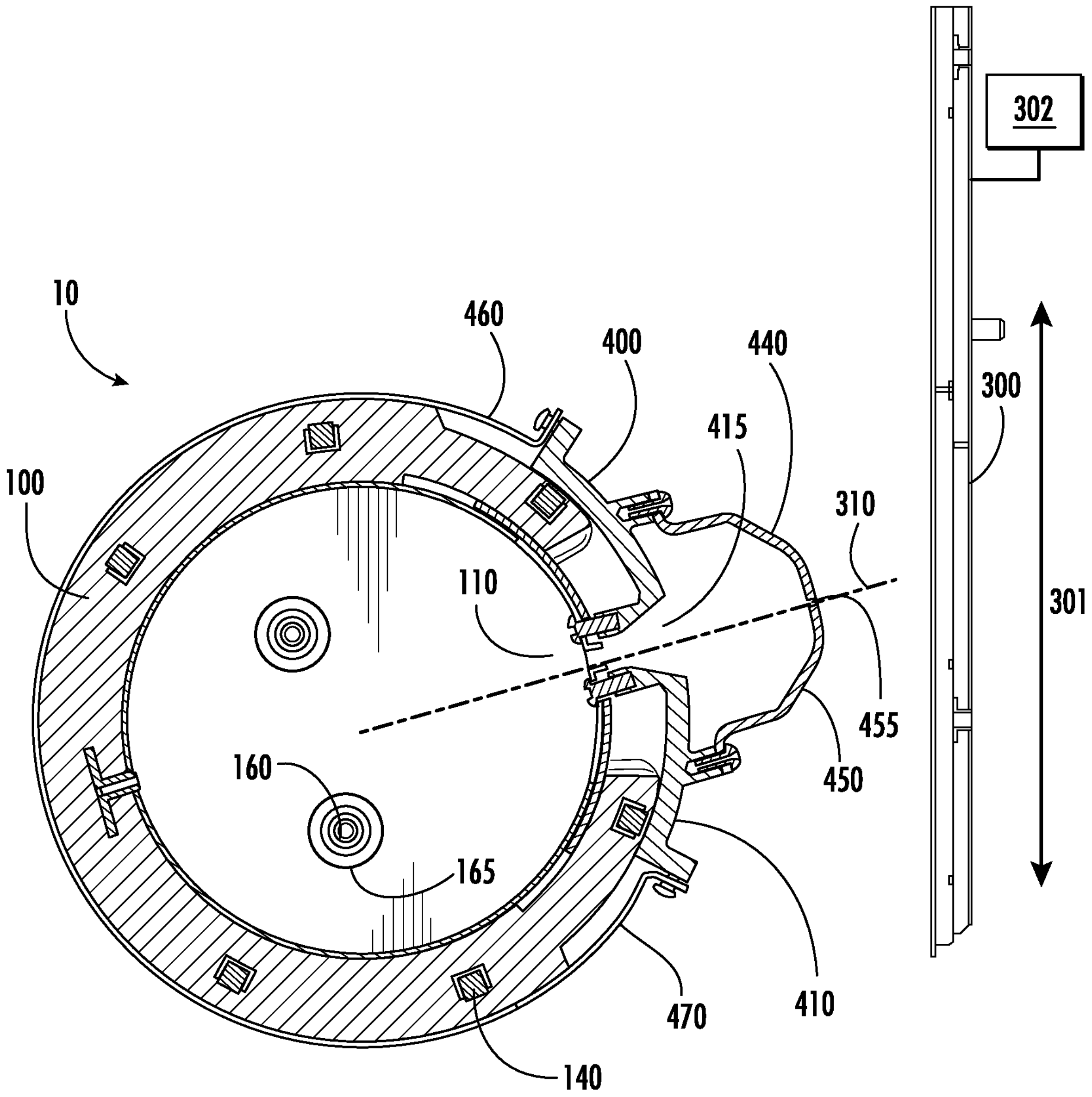
FIGS. 5A-5B show the plasma source of FIG. 4 with the exit aperture having two different sizes.
Figure 5B:
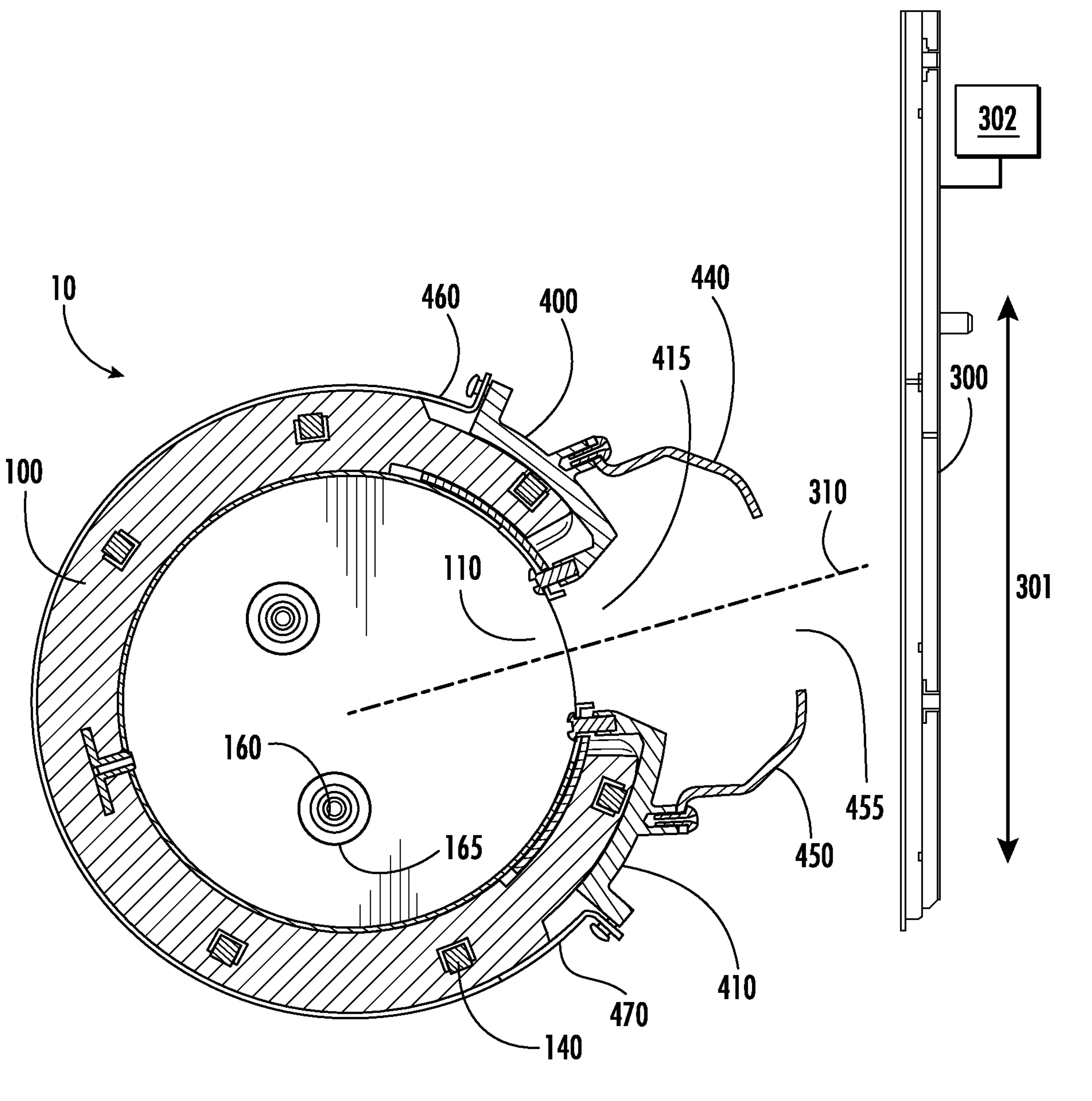

Thus, in this embodiment, it is possible to rotate the exit aperture 415, while maintaining a constant size of the exit aperture, as was described above, by moving the two adjustable output plate portions. Additionally, it is possible to vary the size of the exit aperture 415 in the circumferential direction by independent control of the upper adjustable output plate portion 400 and the lower adjustable output plate portion 410. FIG. 5A shows the exit aperture 415 and the corresponding defining aperture 455 when the two adjustable output plate portions are independently moved so as to be positioned very close to one another, such that the exit aperture 415 is small. In contrast, FIG. 5B shows a much larger exit aperture 415 and defining aperture 455 created by moving the two adjustable output plate portions away from one another.

Further, in this embodiment, the upper and lower adjustable output plate portions each include aperture walls 215, which define the range of motion in one direction. Contact with the other adjustable output plate portion defines the range of motion in the opposite direction.

Although not shown, the upper and lower adjustable output plate portions may also be used with biased external electrodes, such as those shown in FIG. 6. In this configuration, the size of the aperture in the electrodes may vary as the size of the exit aperture 415 varies.

The embodiments described above in the present application may have many advantages. By providing a plasma source that has an adjustable exit aperture, the plasma source can be readily used for various different semiconductor processes. Further, by rotating only a portion of the plasma source, most of the other connections to the plasma source, such as gas inlets, cooling channels, and electrical connections may remain fixed in place while the exit angle is adjusted.

Further, multiple processes that utilize different angles may be performed without breaking vacuum. For example, the plasma source 10 may be configured so that the exit aperture 210 is at a first angle relative to the workpiece. The workpiece may then be scanned using the workpiece holder 300 in the scan direction 301 so that all of the workpiece is processed by the beam at this first angle. In some embodiments, at a scan endpoint, the workpiece holder 300 may rotate 180° and then scan in the opposite direction, allowing the rotated workpiece to be exposed to the beam at this first angle. Then, the plasma source 10 may be modified while maintaining vacuum so that the exit aperture 210 is at a second angle relative to the workpiece. This rotation of the adjustable output plate 200 may occur while the workpiece holder 300 is at a scan endpoint. The workpiece holder 300 may then move along the scan direction 301 so that the workpiece is processed by the beam at this second angle. Again, in some embodiments, the workpiece holder 300 may rotate 180° and then scan in the opposite direction, allowing the rotated workpiece to be exposed to the beam at this second angle.

Thus, workpieces may be processed using beam at different angles without breaking vacuum. This is due to the fact that the plasma source 10 may be adjusted at any time, not only during an idle or maintenance state.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A plasma source for generation of ions and neutral particles, comprising:

a chamber housing having a cylindrical body and two ends, defining a plasma chamber, wherein a housing aperture is disposed in the cylindrical body along a circumferential direction;

a plasma generator to generate a plasma within the plasma chamber; and an adjustable output plate disposed outside the cylindrical body and covering the housing aperture, the adjustable output plate having an arc shape and having a length in the circumferential direction larger than the housing aperture, wherein the adjustable output plate has an exit aperture, wherein the adjustable output plate is rotatable relative to the housing aperture.

2. The plasma source of claim 1, wherein the housing aperture occupies a distance that corresponds to at least 30° of a perimeter of the cylindrical body.

3. The plasma source of claim 1, further comprising an external plate affixed to the adjustable output plate having a defining aperture that is aligned with the exit aperture.

4. The plasma source of claim 3, wherein the external plate is electrically connected to the adjustable output plate.

5. The plasma source of claim 3, wherein the external plate is electrically isolated from the adjustable output plate and biased at a voltage different from the adjustable output plate.

6. The plasma source of claim 5, further comprising at least one additional electrode, biased at a different voltage than the external plate, disposed outside and aligned with the exit aperture.

7. The plasma source of claim 1, wherein the housing aperture defines a range of motion for the adjustable output plate, and the range of motion is at least 30°.

8. The plasma source of claim 1, further comprising a motor in communication with the adjustable output plate, wherein actuation of the motor is used to rotate the adjustable output plate relative to the housing aperture so as to change an angle of the exit aperture relative to a workpiece holder.

9. A processing system, comprising:

the plasma source of claim 1; and a workpiece holder, movable in a scan direction.

10. A plasma source for generation of ions and neutral particles, comprising:

a chamber housing having a cylindrical body and two ends, defining a plasma chamber, wherein a housing aperture is disposed in the cylindrical body along a circumferential direction;

a plasma generator to generate a plasma within the plasma chamber; and an adjustable output plate disposed outside the cylindrical body, wherein the adjustable output plate comprises an upper adjustable output plate portion and a lower adjustable output plate portion which are rotatable relative to the chamber housing, and wherein a space between the upper adjustable output plate portion and the lower adjustable output plate portion defines an exit aperture through which the ions and neutral particles exit the plasma chamber.

11. The plasma source of claim 10, wherein a range of motion of the exit aperture is at least 30°.

12. The plasma source of claim 10, wherein a size of the exit aperture in a circumferential direction is adjustable.

13. The plasma source of claim 10, further comprising an external plate comprising an upper external plate portion affixed to the upper adjustable output plate portion and a lower external plate portion affixed to the lower adjustable output plate portion, wherein a space between the upper external plate portion and the lower external plate portion defines a defining aperture, wherein the defining aperture is aligned with the exit aperture.

14. The plasma source of claim 13, wherein the upper external plate portion is electrically connected to the upper adjustable output plate portion and the lower external plate portion is electrically connected to the lower adjustable output plate portion.

15. The plasma source of claim 13, wherein the upper external plate portion and the lower external plate portion are electrically isolated from the adjustable output plate and biased at a voltage different from the adjustable output plate.

16. The plasma source of claim 15, further comprising at least one additional electrode, biased at a different voltage than the upper external plate portion and the lower external plate portion, disposed outside and aligned with the exit aperture.

17. The plasma source of claim 10, further comprising at least one motor in communication with the upper adjustable output plate portion and the lower adjustable output plate portion, wherein actuation of the at least one motor is used to rotate the upper adjustable output plate portion and the lower adjustable output plate portion relative to the housing aperture so as to change an angle of the exit aperture relative to a workpiece holder and/or a size of the exit aperture.

18. The plasma source of claim 17, wherein the upper adjustable output plate portion and the lower adjustable output plate portion are independently rotatable.

19. A processing system, comprising:

the plasma source of claim 10; and a workpiece holder, movable in a scan direction.

* * * * *